United States Patent [19]

Hardy et al.

[11] Patent Number: 4,695,799
[45] Date of Patent: Sep. 22, 1987

[54] NMR MAGNETIZATION INVERSION BY NON-LINEAR ADIABATIC FAST PASSAGE

[75] Inventors: Christopher J. Hardy; William A. Edelstein, both of Schenectady, N.Y.

[73] Assignee: General Electric Company, Schenectady, N.Y.

[21] Appl. No.: 746,146

[22] Filed: Jun. 18, 1985

[51] Int. Cl.⁴ ............................................. G01R 33/20
[52] U.S. Cl. ..................................... 324/307; 324/313; 324/309; 324/311
[58] Field of Search ................ 324/307, 313, 309, 311

[56] References Cited

U.S. PATENT DOCUMENTS

| | | | |
|---|---|---|---|
| 3,826,972 | 7/1974 | Day et al. ........................ | 324/313 X |
| 4,390,840 | 6/1983 | Ganssen et al. ..................... | 324/309 |
| 4,565,968. | 1/1986 | Macovski ......................... | 324/306 X |
| 4,577,152 | 3/1986 | Macovski ............................. | 324/309 |

OTHER PUBLICATIONS

"Broadband Population Inversion by Phase Modulated Pulses", J. Baum et al., J. Chem. Phys. 79(9), 1 Nov. 1983.

Primary Examiner—Tom Noland
Attorney, Agent, or Firm—Geoffrey H. Krauss; James C. Davis, Jr.; Marvin Snyder

[57] ABSTRACT

A method for the complete inversion of magnetization by adiabatic fast passage during an NMR experiment on a sample having a selected nuclear specie with a Larmor frequency $\omega_0$. A radio-frequency magnetic field is generated with an amplitude $B_1$ and an instantaneous frequency $\omega(t)$ which is non-linearly swept, as a function of time, from a minimum frequency $\omega_l$ substantially at a maximum offset frequency $\Delta\omega$ below the Larmor frequency $\omega_0$, through the Larmor frequency, to a maximum frequency $\omega_h$ substantially at the maximum offset frequency $\Delta_\omega$ above the Larmor frequency. The non-linearly swept, monotonic RF signal is applied to the sample-being-investigated for a sweep time interval sufficient to invert the magnetization of the selected nuclear specie. The preferred sweep is a tangential function:

$$\omega(t) = \omega_0 \pm \gamma B_1 \tan(\arcsin(\omega_s t)), \quad (A)$$

or $$\omega(t) = \omega_0 \pm \gamma B_1 \tan(\omega_s t)$$

where $\omega_s = \alpha\gamma B_1$, $\gamma$ is the gyromagnetic ratio of the selected nuclear specie and $0 < \alpha \leq 1$.

11 Claims, 10 Drawing Figures

NMR MAGNETIZATION INVERSION BY NON-LINEAR ADIABATIC FAST PASSAGE

BACKGROUND OF THE INVENTION

The present invention relates to nuclear magnetic resonance (NMR) sample investigation and, more particularly, to novel methods for the inversion of the magnetization by non-linear adiabatic fast passage (AFP) to minimize the radio-frequency (RF) power dissipated in the sample to be investigated.

Many NMR techniques, such as inversion recovery, spin echo and the like which may be utilized to provide a human-viewable image of a sample, require the inversion of the magnetization M vector. NMR magnetization inversion is usually achieved by application of a 180°, or a $\pi$-radian, RF pulse at the NMR resonance, or Larmor, frequency. However, use of a 180° inverting pulse requires a high degree of homogeneity in both the static magnetic field and the RF magnetic field if relatively low distortion of the final image is to be generated. It is well known that the magnetization vector inversion technique called adiabatic fast passage (AFP) can generally produce magnetization inversion which is much less sensitive to inhomogeneity in either or both of the main static magnetic field $B_O$ or the RF magnetic field $B_1$. The AFP inversion technique applies a strong RF pulse while sweeping either the static magnetic field magnitude $B_O$ or the RF field instantaneous frequency $\omega$ linearly through resonance while meeting the condition, first described by Bloch in 1946, that:

$$B_1/T_2 << (dB_O/dt) << \epsilon B_1^2 \tag{1}$$

where $T_2$ is the spin-spin relaxation time and $\gamma$ is the gyromagnetic ratio of the nuclear specie to be imaged. The use of AFP provides increased accuracy margins in many NMR procedures1; however, the AFP technique requires deposition in the sample of more than 10 times as much RF power, relative to the amount of power required for magnitization inversion by a 180° RF pulse, and is thus not seriously considered for NMR experiments upon relatively sensitive living tissue samples. Since it is relatively difficult to sweep the static magnetic field magnitude $B_O$, especially in an NMR medical imaging system, it is desirable to provide an RF frequency sweep for adiabatic-fast-passage magnetization vector inversion, which not only has a relative insensitivity to any inhomogeneitics in the static magnetic $B_O$ or RF magnetic $B_1$ fields, but also minimizes the required RF power magnitude.

BRIEF SUMMARY OF THE INVENTION

In accordance with the present invention, a method for complete inversion of magnetization by adiabatic fast passage during an NMR experiment on a sample having a nuclear specie with a Larmor frequency $\omega_O$, comprises the steps of:

(a) generating a radio-frequency magnetic field having an amplitude $B_1$ and an instantaneous frequency $\omega$;

(b) controlling the frequency $\omega(t)$ to non-linearly sweep, as a function of time, from either a minimum frequency $\omega_l$ substantially at an offset frequency $\Delta\omega$ below the Larmor frequency $\omega_O$ or a maximum frequency $\omega_h$ substantially at the offset frequency $\Delta\omega$ above the Larmor frequency, through the Larmor frequency $\omega_O$, to the remaining one of the minimum or maximum frequencies; and (c) applying the non-linearly swept RF signal to the sample-being-investigated for a sweep time interval sufficient to invert the magnetization of the selected nuclear specie.

In presently preferred embodiments, the non-linear sweep frequency $\omega(t)$ is responsive to the tangent of a selected quantity, in accordance with either of the equations (A) or (B):

$$\omega(t) = \omega_O \pm \gamma B_1 \tan(\arcsin(\omega_s t)) \tag{A}$$

or $$\omega(t) = \omega_O \pm \gamma B_1 \tan(\omega_s t) \tag{B}$$

where $\omega_s = \alpha \gamma B_1$, and $\gamma$ is the gyromagnetic ratio of the nuclear specie and $0 < \alpha \leq 1$.

Accordingly, it is an object of the present invention to provide novel methods for producing complete inversion of the magnetization, in NMR apparatus having at least potential inhomogeneity in at least one of the main static magnetic field and radio-frequency magnetic field, utilizing a non-linear adiabatic-fast-passage frequency sweep.

This and other objects of the present invention will become apparent upon a reading of the following detailed description, when considered in conjunction with the drawings.

BRIEF DESCRIPTION OF THE DRAWINGS

FIG. 4c is a graph of the final Z-axis magnetization, after inversion, as a function of Larmor (resonance) frequency error, equivalent to a main static field error, for the RF $\pi$-pulse inversion and for a first tangential form, node 2 AFP sweep inversion.

DETAILED DESCRIPTION OF THE INVENTION

Figure 1A:
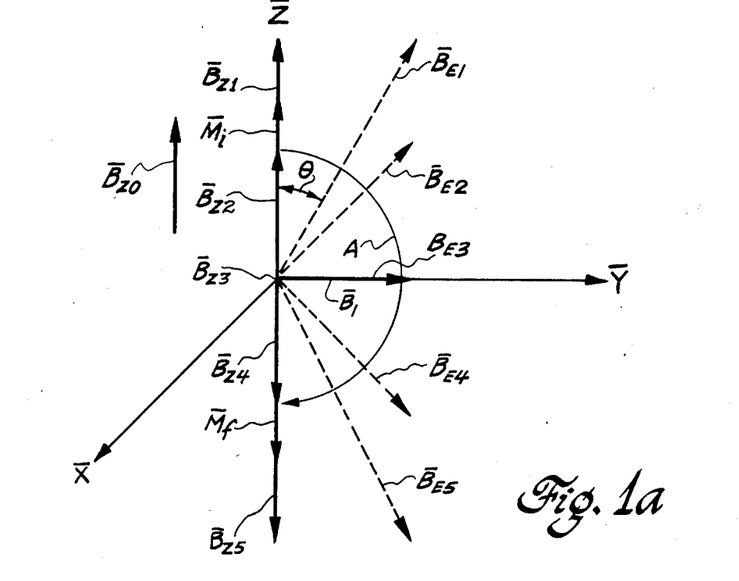
FIG. 1a is a three-dimensional representation of the RF, net axial and total effective magnetic fields present during an adiabatic fast passage magnetization inversion.

Referring initially to FIG. 1a, the total effective magnetic field $\overline{B}_E$ (shown by the associated dashed vector arrows) is illustrated at several times during an inversion of magnetization $\overline{M}$ by adiabatic fast passage. The $\overline{X}$, $\overline{Y}$, $\overline{Z}$, spatial frame shown is a reference frame which is rotating at the Larmor frequency $\omega_O$ about the $\overline{Z}$ axis of the laboratory frame. Prior to the beginning of the AFP frequency sweep, the initial magnetization vector $\overline{M}_i$ is substantially parallel to the direction of the main static magnetic field vector $\overline{B}_{ZO}$, i.e. along the $+\overline{Z}$ axis. As the RF magnetic field has not yet been turned on, there is no magnetization or magnetic field component in any direction orthogonal to the $\overline{Z}$ axis, i.e. an RF field vector $\overline{B}_1$ along for example, the $\overline{Y}$ axis, has an amplitude of zero.

When the AFP inversion sweep commences, the RF magnetic field vector $\overline{B}_1$ is established with a substantially uniform amplitude and in a direction substantially orthogonal to the static field axis. Thus, at the beginning of the AFP sweep the total effective magnetic field $\overline{B}_{E1}$ is the vector sum of the RF magnetic field $\overline{B}_1 = B_1\overline{Y}$ and a net axial magnetic field $\overline{B}_{ZO}=((\omega_O-\omega(t))/\gamma)\overline{Z}$, where $\overline{Y}$ and $\overline{Z}$ are unit vectors in the rotating frame, $\gamma$ is the gyromagnetic constant of the nuclear specie to be operated upon, and the quantity $-(\omega_O-\omega(t))$ is the instantaneous frequency offset of the RF magnetic field, where $\omega(t)$ is the instantaneous RF frequency. In adiabatic fast passage, the RF frequency is swept from a minimum, or low, frequency $\omega_1=\omega_O-\Delta\omega$, where $\Delta\omega$ is the largest offset frequency, to a maximum, or high, frequency $\omega_h=\omega_O+\Delta\omega$. The effective magnetic field magnitude $B_E=\sqrt{(B_1^2+B_Z^2)}$. Substituting for the net axial field $B_Z$ and utilizing the Larmor relationship $\overline{\omega}=\gamma\overline{B}$, the effective magnetic field $\overline{B}_E$ corresponds to an effective frequency $\omega_{eff}$, (at which the magnetization M precesses about $\overline{B}_E$), at an angle $\theta$ with respect to the positive Z axis, such that $$\omega_{eff} = \sqrt{((\omega_0 - \omega(t))^2 + (\gamma B_1)^2)} \quad (2)$$

and $$\theta = \arctan(\gamma B_1/(\omega_O-\omega(t))). \quad (3)$$

Therefore, as the RF frequency $\omega(t)$ is swept up from the minimum frequency $\omega_1$, through the Larmor frequency $\omega_O$, to the maximum frequency $\omega_h$, there is a change in both the angle and magnitude of the effective magnetic field vector $\overline{B}_E$. The $\overline{Z}$-axis magnetic field component $\overline{B}_z$ first shrinks in magnitude, then passes through zero magnitude and is finally swept down to a position of inversion, i.e. lying in the $-\overline{Z}$ axial direction. The magnetization $\overline{M}$, starting out with the initial equilibrium vector $\overline{M}_i$, in the $+\overline{Z}$ axial direction, will follow the effective magnetic field vector $\overline{B}_E$ to the $-\overline{Z}$ axial direction and become a final magnetization vector $\overline{M}_F$ upon achieving inversion, if the effective magnetic field vector $\overline{B}_E$ is swept down at a slow enough rate.

The sweep rate at which the effective magnetic field vector $\overline{B}_E$ can be swept down in generally given by the Block relationship of equation (1), which can be restated as:

$$(\omega_1/T_2) << |d(\omega(t)-\omega_O)/dt| << \omega_1^2. \quad (4)$$

Thus, if the time rate-of-change of the RF magnetic field frequency is sufficiently slow, the initial effective field $\overline{B}_{E1}$ (present when the RF magnetic field $\overline{B}_1$ is initiated) at the lower frequency $\omega_1(=\omega_O-\Delta\omega)$ will change to an effective magnetic field $\overline{B}_{E2}$, when the frequency has been increased to about $\omega_O-\Delta\omega/2$, such that the $\overline{Z}$-axis magnetic field $\overline{B}_{Z2}$ is about one-half of the original value $\overline{B}_{Z1}$ (and the magnetization vector is about half of the initial magnetization vector $\overline{M}_i$ magnitude). When the sweep frequency $\omega(t)$ has, halfway through the sweep, reached the Larmor frequency $\omega_O$, the effective magnetic field vector $\overline{B}_{E3}$ lies substantially along the $\overline{Y}$ axis and the $\overline{Z}$-axis magnetic field vector $\overline{B}_{Z3}$ is of substantially zero magnitude, while the magnetization vector M has the same magnitude as $\overline{M}_i$ but is now positioned generally about the $\overline{Y}$ axis. When the AFP linear sweep is about three-quarters complete, the frequency $\omega(t)$ is about $\omega_O+\Delta\omega/2$ and the effective magnetic field vector $\overline{B}_{E4}$ has rotated to a position such that the $\overline{Z}$-axis magnetic field component $\overline{B}_{Z4}$ has about half the amplitude of the initial field, but in the $-\overline{Z}$ direction. At the end of the AFP sweep, the frequency $\omega(t)$ is at the maximum frequency $\omega_h=\omega_O+\Delta\omega$, and the effective magnetic field vector $\overline{B}_{E5}$ has a Z-axis projection $\overline{B}_{Z5}$ which is substantially equal to, but in opposite direction from, the vector $\overline{B}_{Z1}$. The RF magnetic field $\overline{B}_1$ is now turned off. The final magnetization vector $\overline{M}_f$ has followed the effective magnetic field vector and has been rotated 180° in spatial orientation, and is now aligned in the $-\overline{Z}$ axial direction; a complete inversion of the magnetization vector has been achieved.

Figure 1B:
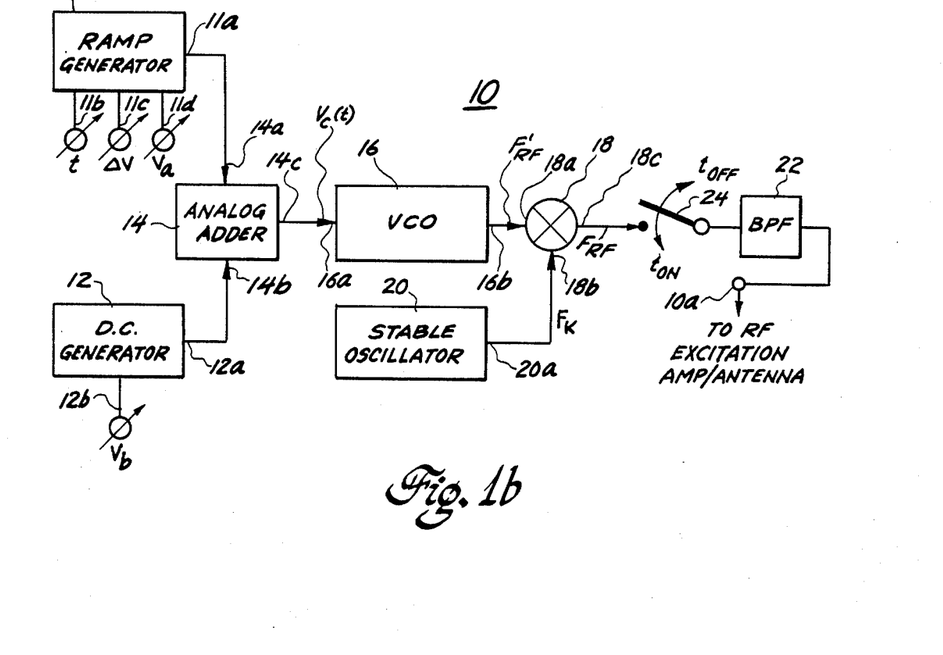
FIG. 1b is a schematic block diagram of apparatus which may be utilized in an NMR system for magnetization inversion by AFP.

Referring now to FIG. 1b, one form of apparatus 10 for providing the adiabatic-fast-passage inversion frequency sweep provides a substantially-constant amplitude, linearly-changing swept frequency RF signal at an output 10a, to an RF excitation amplifier and antenna (not shown for reasons of simplicity) which forms a portion of a magnetic resonance imaging system. In the priior art, a ramp generator 11 generates a substantially linear ramp voltage signal $V_r(t)$ at an output 11a. A ramp time duration control 11b, a ramp amplitude $\Delta V(t)$ control 11c and an average amplitude $V_a$ control 11d are adapted for controlling the time and amplitude characteristics of the output 11a signal. Thus, the output 11a signal voltage $V_r(t)$ can be set to start at a minimum voltage $V_m$ at a ramp start time $t_s$ and to be at a maximum amplitude $V_M$ at a ramp termination time $t_t$, with the sweep passing through the average magnitude $V_a$ at a mid-interval time $t_a$. A DC voltage generator 12 has a output 12a at which a substantially constant DC voltage signal appears with a magnitude $V_b$ established by an associated control 12b. The ramp voltage signal $V_r(t)=V_a+\Delta V(t)$ from ramp generator output 11a is provided to a first input 14a of an analog signal adder means 14, which also receives the DC generator voltage $V_b$ signal from the output 12a at a second input 14b. The voltages are added together and appear at an analog adder output 14c to provide a control voltage $V_c(t)$ signal at the control voltage input 16a of a voltage controlled oscillator (VCO) means 16. The control voltage $V_c(t)$ is of the form $V_O + \Delta V(t)$, such that the RF signal at the VCO means output 14b has a frequency $F'_{RF}$ which linearly changes, with respect to time, from a known minimum frequency at the sweep start time $t_s$ to a known maximum frequency at the sweep termination time $t_t$. The VCO means output signal is provided to a first input 18a of a frequency mixing means 18, having a second input 18b receiving the substantially-constant-frequency $F_k$ signal from the output 20a of a stable oscillator means 20. The two input signals are mixed and the sum and difference frequency products thereof appear at the mixer output 18c. The required primary frequency $F_{RF}$ signal, i.e. $F_{RF} = F'_{RF} + F_k$, is transmitted through a bandpass filter 22, which suitably attenuates the unwanted sum of difference signals, so that only the desired frequency sweep, about the Larmor frequency, is provided to the AFP generator means output 10a. An RF switch means 24 may be utilized, in series with the mixer means output 18c, e.g. between the mixer and bandpass filter 22, to provide the AFP frequency sweep signal beginning at the start time $t_s$ (and at lowest frequency, $\omega_1 = \omega_O - \Delta\omega$, see FIG. 3a) and terminating at the sweep termination time t (at the highest frequency $\omega_h = \omega_O + \Delta\omega$), to prevent the appearance of mixing noise and the like phenomena at times when the AFP frequency sweep is not required.

Figure 2A:
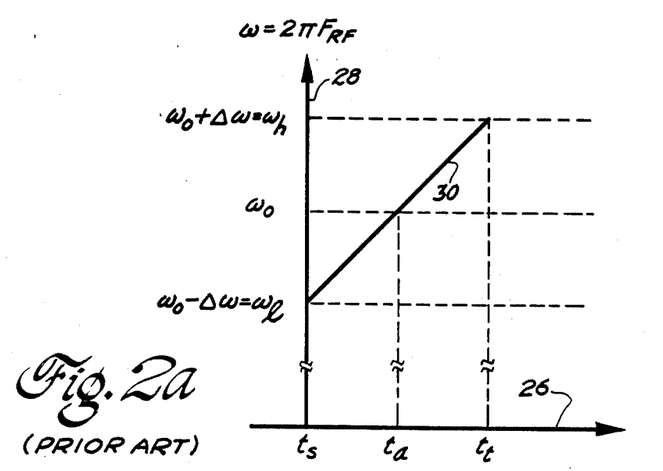
FIG. 2a is a graph illustrating the substantially-linear frequency vs. time relationship of a prior art AFP inversion sweep.

The substantially-linear AFP sweep magnetization inversion method of the prior art is thus summarized in FIG. 2a, wherein time t is plotted along abscissa 26 and frequency $\omega(=2\pi F_{RF})$ is plotted along ordinate 28. The AFP frequency sweep 30 will thus be seen to have an essentially constant slope $d\omega/dt$ during the sweep time interval from sweep start time $t_s$ to sweep termination time $t_t$.

Figure 2B:
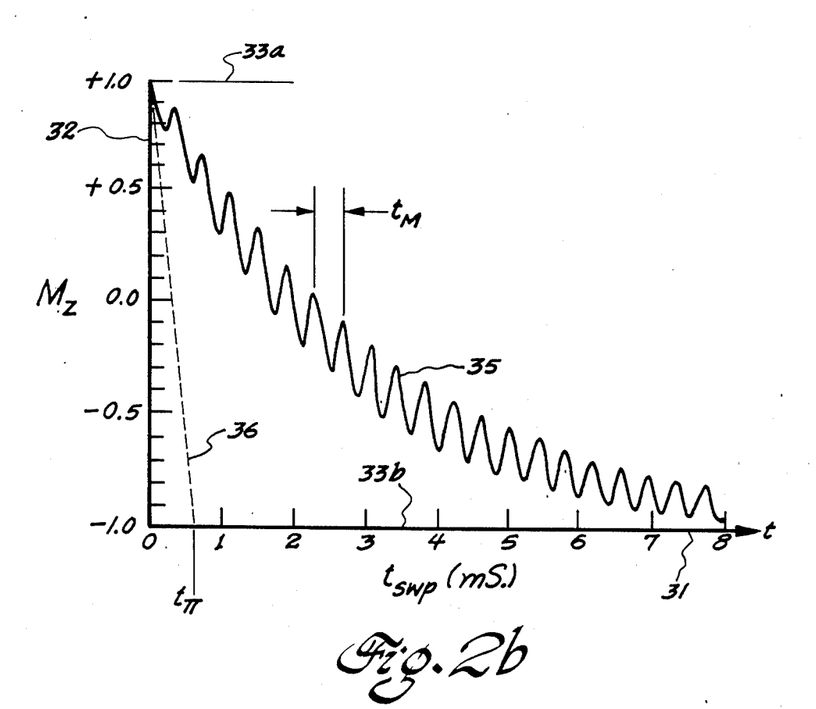
FIG. 2b is a graph illustrating the total Z-axis magnetization as a function of total sweep time, during an AFP inversion sweep.

Referring now to FIG. 2b, wherein elapsed sweep time $t_{swp}$ (in milliseconds. mS.) is plotted along abscissa 31 and the magnitude $M_Z$ of the Z-axis magnetization is plotted along ordinate 32, it will be seen that, although magnetization inversion by use of an AFP pulse is less sensitive to main static magnetic field $B_O$ and RF magnetic field $B_1$ inhomogeneties, the complete inversion of the Z-axis magnetization, from a value of +1.0 (line 33a) to a value of −1.0 (line 33b), follows curve 35 and typically requires about an order of magnitude greater time for complete inversion, with respect to the time $t_\pi$ required for inversion by the use of a 180° (or $\pi$) RF pulse (curve 36). Thus, for inversion in a static magnetic field $B_O$ of about 1.5 Tesla (T) with an RF magnetic field $B_1$ of about 0.20 gauss (G) sweeping through a range from $2\pi \times$ (10 KHz.) below the Larmor frequency to $2\pi \times$ (10 KHz.) above the Larmor frequency, a sweep time of more than 8 mS. is required for an adiabatic-fast-passage magnetization inversion (along curve 35) while time $t_\pi$ of only about 0.6 mS. is required for a 180° $\pi$-pulse inversion (along curve 36). As the amount of RF power deposited in the sample is proportional to the time during which the inverting signal is present and to the square of the RF magnetic field, i.e. $P \propto B_1^2 T$ where T is the pulse width, it will be seen that the AFP frequency sweep pulse requires over 10 times the power of the shorter 180° $\pi$-pulse. In many applications, the additional order of magnitude of dissipated power does not pose a problem; however, for in vivo medical NMR applications, it is important to minimize the amount of RF power absorbed by the patient, and the order-of-magnitude-greater power required by the AFP inversion sweep is unacceptable. Therefore, while it is desirable to use some form of AFP inversion sweep to be capable of withstanding a greater degree of main static magnetic field $B_O$ and RF magnetic field $B_1$ inhomogeneities, the time required for complete magnetization inversion must not be very much larger than the time required for inversion with a simple $\pi$-pulse, to reduce deposition of additional amounts of RF power in the patient being imaged.

We have found that the use of a highly non-linear tangential frequency sweep is considerably more power-refficient than the substantially linear frequency sweep hitherto utilized for adiabatic-fast-passage inversion of the magnetization vector. We restate the Bloch condition, in slightly different form, as:

$$\omega_{eff} \geq |d\theta/dt| \qquad (5)$$

where $\omega_{eff}$ is the frequency of precession of the magnetization vector M about the effective magnetic field vector $B_{eff}$, and $\theta$ is the angle of the effective magnetic field vector $B_{eff}$ with respect to the positive Z axis. Substituting into equation (3) and taking the derivative, with respect to time, thereof, the time rate-of-change of angle $\theta$ is:

$$(d\theta/dt) \leq ((\omega - \omega_O)^2 + (\gamma B_1)^2)^{-1} (\gamma B_1)(d\omega/dt). \qquad (6)$$

Equation (5) can then be written as $$d\omega/dt = (\alpha/\gamma B_1)((\omega - \omega_O)^2 + (\gamma B_1)^2)^{3/2} \qquad (7)$$

for $0 < \alpha \leq 1$. After rearranging terms and integrating, a more optimized AFP inversion sweep is seen to be a form of tangent function, where $$\omega(t) = \omega_0 + \gamma B_1(\omega_S t / \sqrt{(1-(\omega_S t)^2)}) \qquad (8a)$$

where $\omega_S = \alpha \gamma B_1$. For a sweep having equal sweep time before and after the midsweep time $t_{a'}$, this is equivalently given as:

$$\omega(t) = \omega_O + \gamma B_1 \tan(\arcsin(\omega_s(t - t_{a'})). \qquad (8b)$$

Figure 3A:
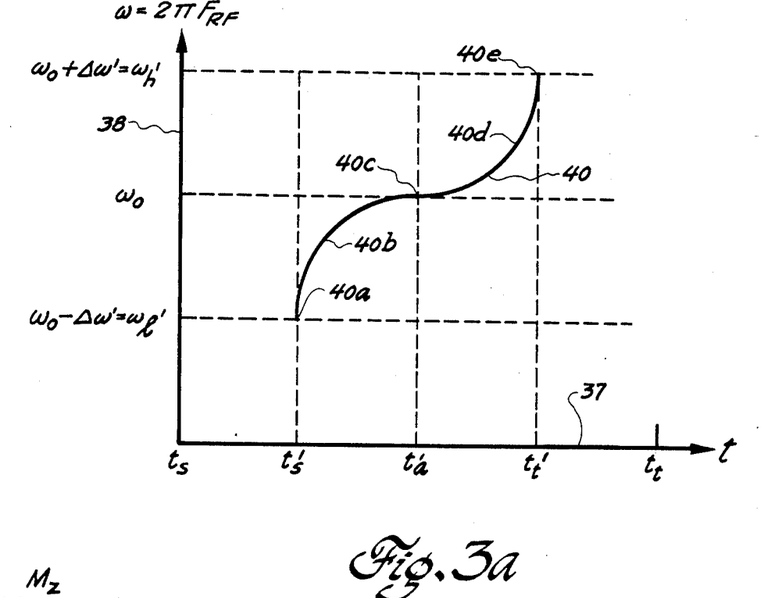
FIG. 3a is a graph illustrating the non-linear AFP frequency vs time relationship of the magnetization inversion method of the present invention.

This tangential frequency sweep is shown in FIG. 3a, wherein sweep time t is plotted along abscissa 37 and frequency $\omega = 2\pi F_{RF}$ is plotted along ordinate 38. This first form of tangential AFP frequency sweep has a curve 40 which starts at a point 40a having the lower frequency $\omega_{1'}$ at the sweep starting time $t_s$, (which is closer to the midsweep center time $t_{a'} = t_a = 0$ than the linear-sweep start time $t_s$) and with a subsequent portion 40b having a rapid frequency increase which slowly tapers off, to provide a minimum (e.g. zero) time rate-of-change of frequency at midsweep point 40c at time $t_{a'} = 0$, approximately halfway through the sweep and with the sweep at approximately the Larmor frequency $\omega_O$. The tangential frequency sweep curve 40 has a second curved portion 40d of increasingly greater time rate-of-change of frequency until a maximum positive time rate-of-frequency-change and the final, highest frequency $\omega_h$, are reached at the AFP sweep pulse termination time $t_{t'}$ (which is earlier than the linear-sweep termination time $t_t$, with respect to the midsweep time, e.g. time $t_a = 0$ or $t_{a'}) = 0$. Because the desired tangential sweep 40 is a monotonic function, the time derivative of the instantaneous sweep frequency $\omega$ is itself a substantially-constantly-varying time function.

We have also found that, by restating the equation (5) Bloch condition as:

$$\omega_{\text{eff}}^2 \geq |d(\omega(t) - \omega_O)/dt|. \tag{9}$$

a similar, but slightly more efficient, inversion sweep is defined. By combining equations (9) and (2), an equality is defined wherein:

$$\alpha((\omega - \omega_O)^2 + (\gamma B_1)^2) = d(\omega - \omega_O)/dt \tag{10}$$

for $0 < \alpha \leq 1$. By rearranging equation (10) and integrating, we have arrived at the inversion sweep-controlling equation, again for a midsweep time $t_{a'}$, of:

$$\omega(t) = \omega_O + \gamma B_1 \tan(\omega_s(t - t_{a'})) \tag{11}$$

where $\omega_s$ is again defined as $\omega_s = \alpha \gamma B_1$; this second form of tangential sweep is similar to the tangential sweep of equation (8b) and has a frequency vs. time relationship (and a sweep frequency time-derivative monotonic function) similar to the first form tangential sweep curve 40 of FIG. 3a. Thus, either one of the highly-nonlinear tangential sweeps requires a much shorter sweep period, as was desired to reduce RF power dissipation in the sample.

Figure 3B:
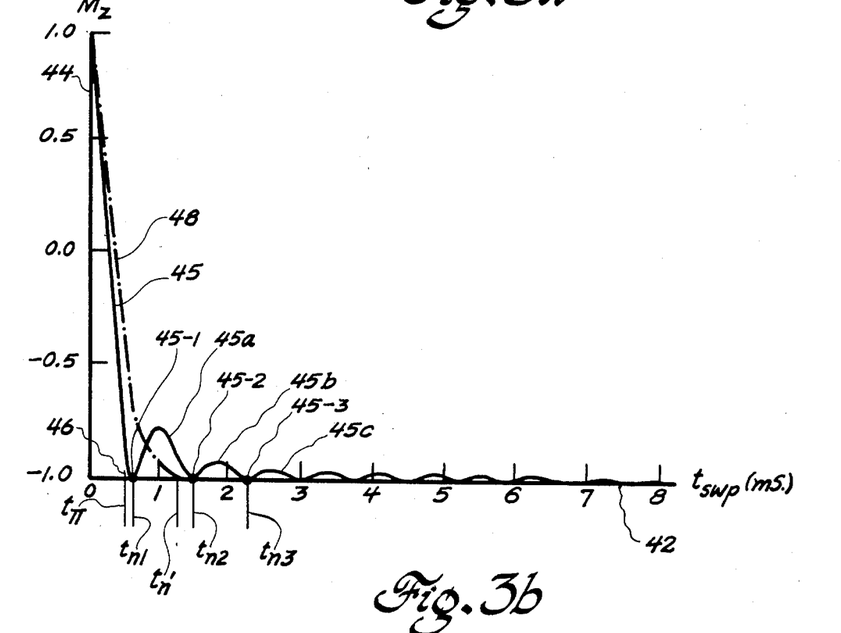
FIG. 3b is a graph illustrating the Z-axis magnetization amplitude, with respect to sweep time, for a tangential AFP inversion sweep in accordance with the present invention.

Referring now to FIG. 3b, the magnitude of the Z-axis magnetization $M_Z$ for the RF $\pi$-pulse, first form tangential inversion RF sweep and second form tangential inversion RF sweep are graphically compared on a graph that indicates sweep time $t_{swp}$, in milliseconds, along abscissa 42 and the Z-axis magnetization, with respect to the positive Z axis, along ordinate 44. The magnetization of the first form tangential RF sweep defined by equation (8b) follows curve 45, arriving at a complete reversal of magnetization, i.e. $M_Z = -1.0$, at the time $t_{n1}$ of a first "null" 45-1. The first tangential form sweep final magnetization has a series of lobes 45a, 45b, 45c, ..., each occurring between a pair of adjacent "nulls" 45-1, 45-2, 45-3, ..., at which null times $t_{n1}$, $t_{n2}$, $t_{n3}$, ... the magnetization is essentially at the inversion $-1.0$ magnitude. For a tangential frequency sweep wherein the RF magnetic field is of magnitude $B_1 = 0.20$ G and the swept frequency $\omega(t)$ is swept from $2\pi \times (-10$ KHz.) below the resonance frequency $\omega_O$, through the resonance frequency and to a high frequency $2\pi \times (+10$ KHz.) greater than the resonance frequency, complete inversion will occur at the first node time $t_{n1}$ of about 0.65 mS. By way of comparison, a 180° $\pi$-pulse RF inversion signal will have a very similar effect on the initial change of magnetization and will provide an essentially complete inversion of the Z-axis magnetization at a time $T_\pi$ (illustrated by broken line segment 46) of about 0.59 mS. Thus, utilizing the first form tangential RF sweep wherein $\omega(t) = \omega_O + \gamma B_1 \tan(\sin^{-1}(\omega_s t))$, and the second node thereof, will require a sweep time less than about three times longer than the $\pi$-pulse duration, and less than about three times more power will be deposited in the sample, while providing considerably more tolerance, as will be illustrated, to errors in the main static and/or RF magnetic fields.

The second form tangential RF sweep, wherein $\omega(t) = \omega_O + \gamma B_1 \tan(\omega_s t)$, provides an instaneous Z-axis magnetization curve 48; the curve essentially reaches the perfect magnetization inversion $-1.0$ value at a time $t_{n'}$ and remains thereat for times greater than perfect inversion time $t_{n'}$. For the illustrative case where the RF magnetic field magnitude $B_1$ is again 0.200, and for a sweep from an initial frequency of about $2\pi \times (20$ KHz.) below resonance to a final frequency of about $2\pi \times (20$ KHz.) greater than resonance, a perfect inversion time $t_{n'}$ of about 1.25 mS. is required.

Figure 4A:
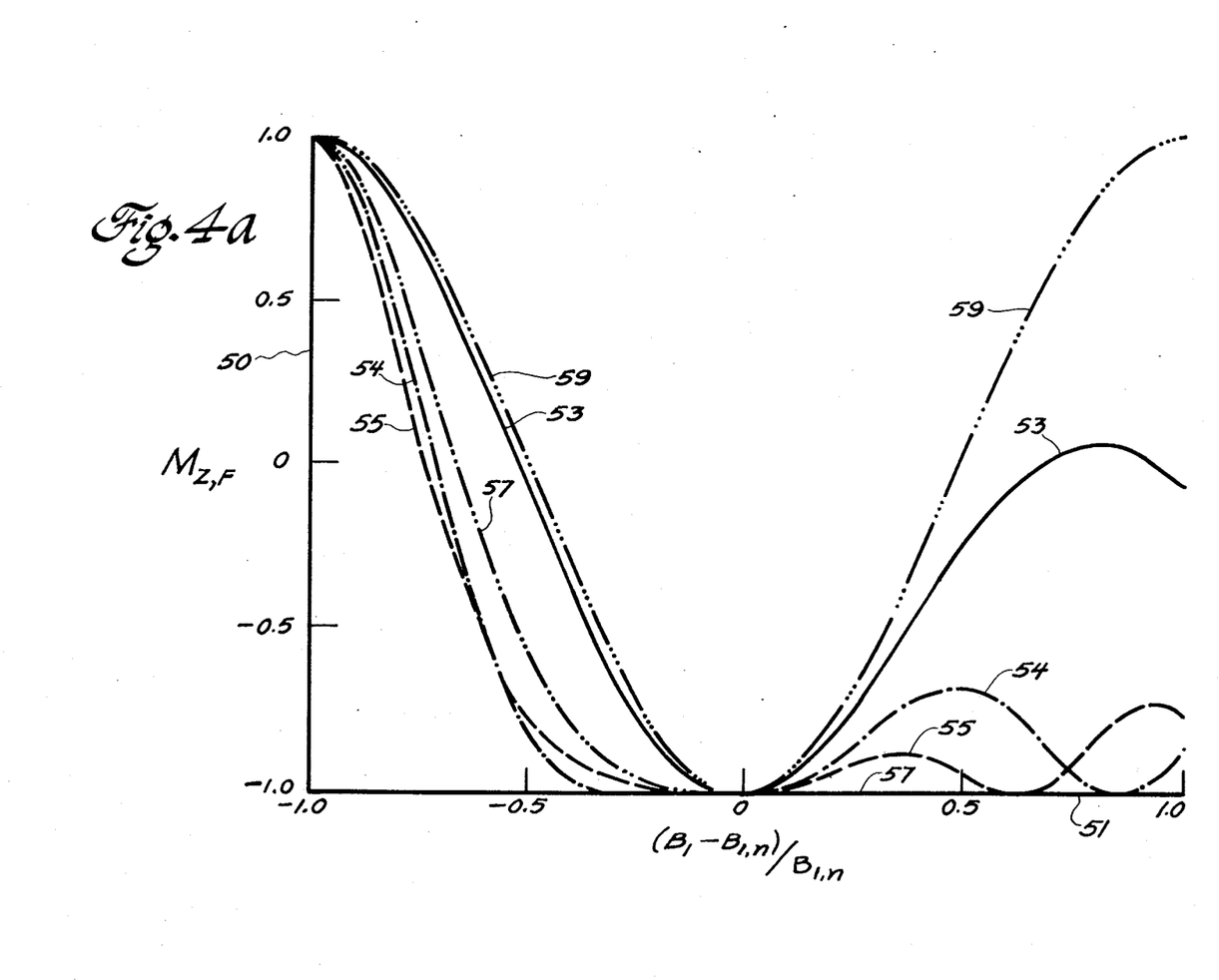
FIG. 4a is a graph illustrating the final Z-axis magnetization after inversion as a function of RF magnetic field $B_1$ fractional error, for an RF $\pi$-pulse inversion and for inversion by either a tangential AFP sweep of the first form and at nodes 1, 2 or 3 thereof or a tangential AFP sweep of a second form.

Referring now to FIG. 4a, the final Z-axis magnetization $M_{Z,F}$, after an attempted perfect inversion by application of a known RF magnetic field $B_1$, is plotted along ordinate 50 as a function of the fractional error in the RF magnetic field $B_1$ (with respect to the normal RF magnetic field magnitude $B_{1,n}$) for the $\pi$-pulse, for the first three nodes of the first form tangential AFP sweep and for the second form AFP tangential sweep. The magnetization curve 53 (solid line) shows the actual magnetization along the Z axis, with respect to the $+Z$ axis initial magnitude prior to inversion, of a first form AFP inversion frequency sweep terminated at a sweep time equivalent to the node 1 time $t_{n1}$ of FIG. 3a. Curve 54 (single chain line) is the final Z-axis magnetization for a first form AFP inversion frequency sweep provided for a time interval until the second node time $t_{n2}$ needed for a $B_{1,n}$ RF magnetic field. Curve 55 (broken line) is the final Z-axis magnetization for a first form AFP inversion frequency sweep extending in time until third node time $t_{n3}$. Double chain curve 57 illustrates the final magnetization obtained utilizing the second tangential form of AFP frequency sweep, with a sweep time of 2 mS. For comparison, triple-chain curve 59 is the final Z-axis magnetization after a 180° RF $\pi$-pulse. It will be seen that, for RF magnetic field $B_1$ magnitudes substantially equal to the expected magnitude $B_{1,n}$ (i.e. fractional values near 0 along abscissa 51), all of the inversion signals provide a substantially complete inversion. It will also be seen that the first form $(\tan(\sin(\omega_s t)))$ sweep, first node curve 53 has almost the same amount of error as a $\pi$-pulse for fractional errors from $-1.0$ to about $+0.2$, and has only about half of the final error for fractional RF magnetic field errors in excess of 0.2, with respect to the $\pi$-pulse error. The sensitivity when using the first form sweep at its second node (curve 54) or at its third node (curve 55) is clearly less for almost all fractional errors, with use of the second node providing almost perfect inversion for fractional errors between about $-0.3$ and 0.05, while the third node provides almost perfect inversion for fractional errors between about $-0.1$ and 0.05. It will also be seen that the second form $(\tan(\omega_s t))$ of the tangential AFP sweep (curve 57) provides essentially perfect inversion for fractional errors at least as large, in the negative error direction, as the first and third nodes (although not the second node), but provides perfect inversion for fractional errors of positive sign, i.e. greater than zero. Thus, if one utilizes the second tangential AFP sweep function and overdrives the RF magnetic field (e.g. utilizes an RF magnetic field amplitude $B_1$ of 0.3 G rather than 0.2 G), there is a large region about the central value where a good inversion will be achieved, and this region is larger than the essentially-complete inversion regions of either the $\pi$-pulse or the first form tangential AFP sweep.

Figure 4B:
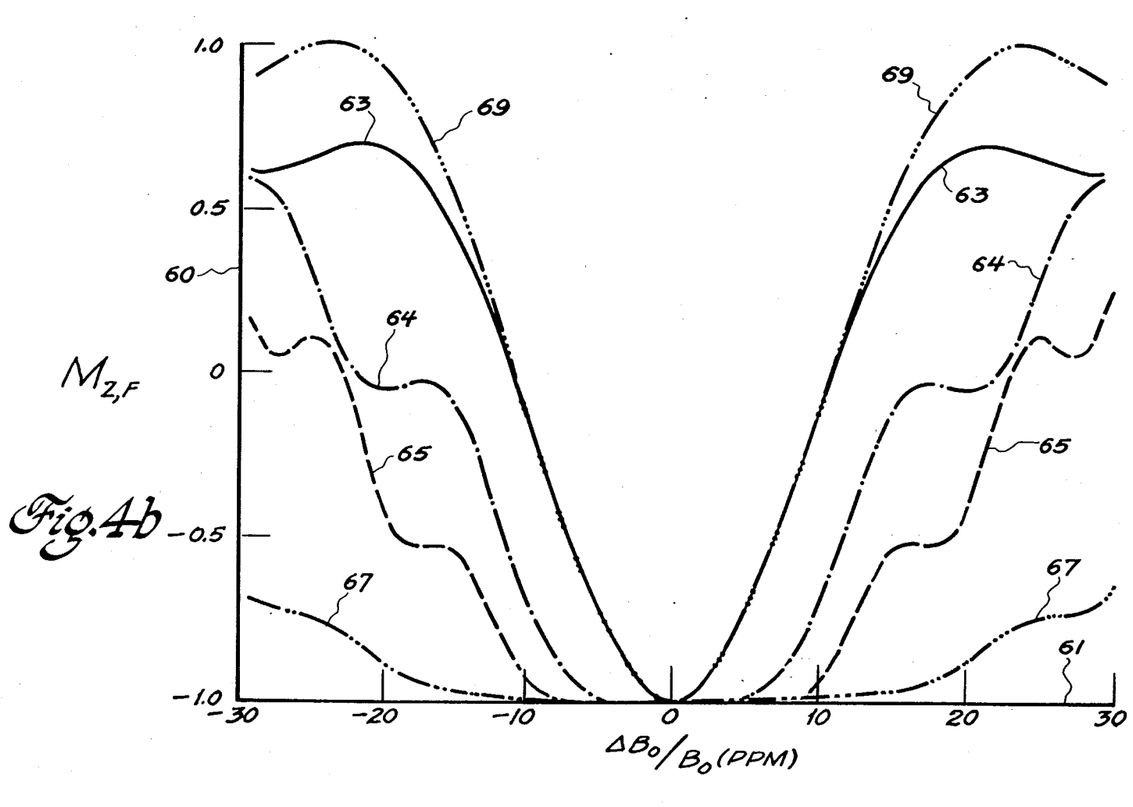
FIG. 4b is a graph illustrating final Z-axis magnetization after inversion, as a function of static field $B_O$ error, for an RF $\pi$-inversion pulse, or for a first form AFP inversion sweep at each of its nodes 1, 2 or 3, or for a second form AFP inversion sweep.

Referring now to FIG. 4b, the final Z-axis magnetization value $M_{Z,F}$ is plotted along ordinate 60, while the main static magnetic field $B_O$ error, or offset, $\Delta B_O/B_O$ is plotted, in parts per million, along abscissa 61. Curves 63, 64 and 65 illustrate the final Z-axis magnetization sensitivity to main static magnetic field $B_O$ error for the first form tangential sweep at nodes 1, 2 and 3, respectively, while curve 67 is the effect of the main static magnetic field offset on the magnetization inversion utilizing the second, and presently preferred, form of tangential AFP inversion frequency sweep. Curve 69 is, for comparison, the sensitivity of the 180° RF $\pi$-pulse for inhomogeneity in the main static magnetic field. It will be seen that the first form, node 1 AFP frequency sweep again behaves very much like the simple 180° RF $\pi$-pulse, with respect to main static magnetic field sensitivity. The first form second node sensitivity (curve 64) is somewhat better, and the third node (curve 65) is even less sensitive. However, the preferred second form (with $\omega(t)=\omega_O+\tan(\cap_s t)$) has, as shown by curve 67, considerably reduced sensitivity with respect to all of the first form characteristics and the $\pi$-pulse characteristic.

Figure 4C:
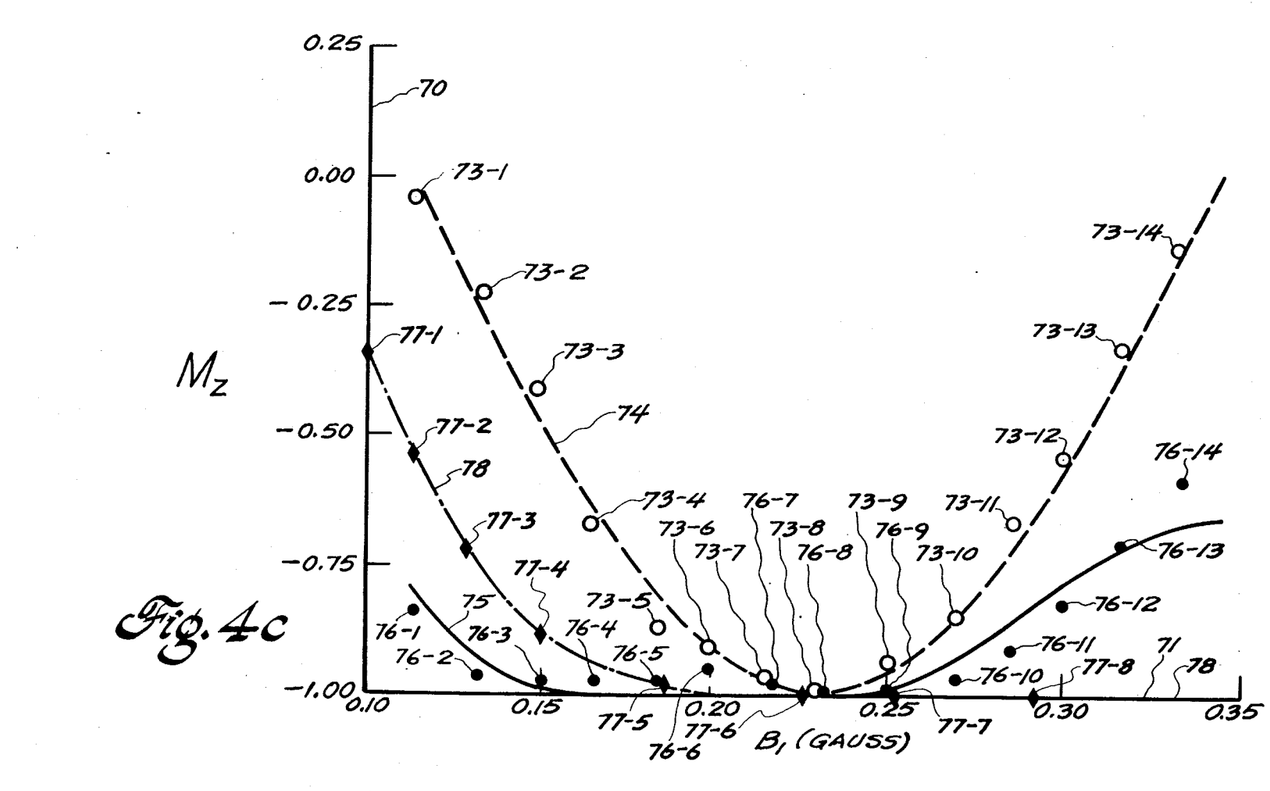
FIG. 4c is a graph illustrating the final Z-axis magnetization, as a function of the RF magnetic field $B_1$ magnitude, for an RF $\pi$-pulse inversion; and for a first tangential form node 2 AFP sweep inversion.

FIG. 4c illustrates a comparison between predicted and actual results obtained in an NMR imaging system. A small vial phantom was placed in the main static magnetic field $B_O$ of the NMR system and an inversion recovery pulse sequence was run, with the response signal (from the nuclei of the material in the phantom vial) being read out immediately after inversion, so that the response signal amplitude was a direct measure of the completeness of Z-axis magnetization inversion. The amplitude of the inverting pulse was varied to produce errors in the RF magnetic field $B_1$ amplitude. In this Figure, wherein the final magnetization value $M_Z$ is plotted along ordinate 70 for RF field magnitude $B_1$ plotted along abscissa 71, the open circles 73-1 through 73-14 represent the associated experimental response signal magnitudes for a $\pi$-pulse inversion-recovery sequence, for a range of values of the RF magnetic field amplitude $B_1$; it will be seen that the predicted $\pi$-pulse inversion final magnetization curve 74 closely agrees with the actual degree of magnetization inversion experimentally obtained. The solid dot points 76-1 through 76-14 are the final magnetization values, at the same 14 values of the RF magnetic field magnitude $B_1$, experimentally obtained using an inversion-recovery sequence with an AFP inversion frequency sweep of the form $\omega(t)=\omega_O+\tan(\text{arc sin}(\omega_s t))$; the experimental value points 76 are in substantial agreement with the theoretical inversion-completeness curve 75 for this first form of inversion frequency sweep at the second node. The solid diamond points 77-1 through 77-8 are the final magnetization values experimentally obtained varying the inversion recovery sequence with an AFP inversion frequency sweep of the form $\omega(t)=\omega_O+\tan(\omega_s t)$; the experimental values of parts 77 are not only essentially on the theoretical curve 78, but also verify that a much larger RF magnetic field amplitude error range can be accommodated, with respect to the amplitude error range accommodatable with a 180° RF $\pi$-pulse for substantially-complete inversion.

Figure 4D:
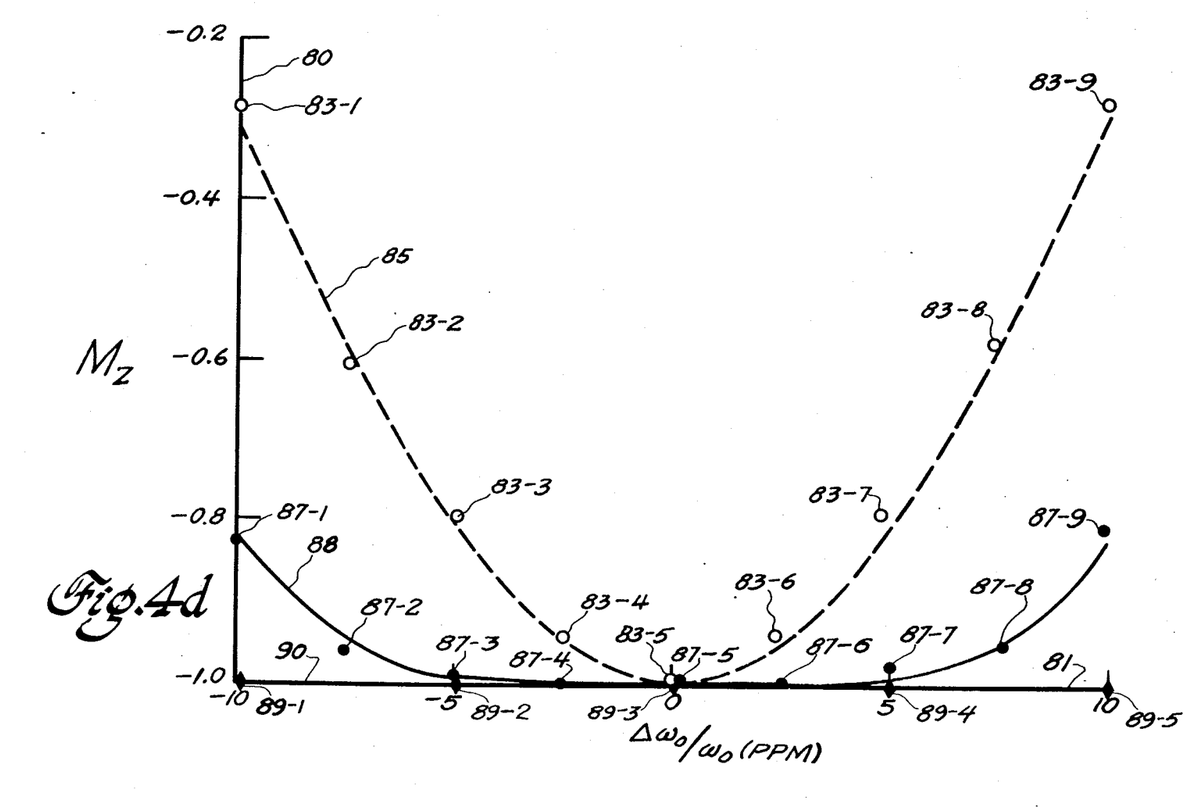

FIG. 4d illustrates the effect of a main static magnetic field $B_O$ error, approximated by offsetting the frequency $\omega_O$ of the inverting pulse by a known amount $\Delta\omega_O$. Final Z-axis magnetization magnitude $M_Z$ is plotted along ordinate 80 while the relative resonance frequency error $\Delta\omega_O/\omega_O$ is plotted, in parts per million (at $\omega_O=2\pi \times (63 \text{ MHz})$), along abscissa 81. The open circle data points 83-1 through 83-9 are the experimental results for nine error values, achieved by providing one of nine constant but different voltage levels into the VCO of apparatus 10. The experimental data points 83 are in essential agreement with the predicted response curve 85 for a 180°0 RF $\pi$-pulse inversion. Solid data points 87-1 through 87-9 are the final magnetization values obtained with the same inversion-recovery method and at the same inverting pulse offset frequency values as curve 85. The offset frequencies were achieved by offsetting the tangential ramp voltage $V_c(t)$ by one of nine different DC levels, prior to introduction into the VCO control voltage input. It will be seen that the first form tangential AFP inversion frequency sweep, second node, data points 87 are also in essential agreement with the theoretical curve 88 therefor. The final magnetization values obtained with a second tangential form AFP inversion sweep has data points 89-1 through 89-5 which lie along a curve 90 and again illustrates that inversion by a tan $(\omega_s t)$ tangential AFP sweep is much less sensitive to static field inhomogeneity than inversion by either a first tangential form AFP sweep or a 180° RF $\pi$-pulse.

Magnetization inversion by a non-linear, tangential frequency sweep for adiabatic fast passage will provide essentially complete magnetization inversion in an inversion time interval on the same order of magnitude as the time interval required for a 180° RF $\pi$-pulse magnetization inversion, and will be considerably less sensitive to inhomogeneities or changes in the main static magnetic field $B_O$ and/or RF magnetic field $B_1$.

While several presently preferred embodiments of our novel non-linear tangential adiabatic-fast-passage frequency sweep for magnetization inversion have been described in detail herein, many modifications and variations will now become apparent to those skilled in the art. As one example, the linear ramp generator means can now be subject to modification to provide a non-linear ramp signal having the desired first or second tangential form. Similarly, it is within the scope of our novel AFP inversion frequency sweeps to have any sweep beginning at a higher frequency $(\omega_O+\Delta\omega)$ and proceed through the Larmor frequency $\omega_O$ to a lower frequency $(\omega_O-\Delta\omega)$; equations (A) and (B) thus have the general forms: $\omega(t)=\omega_O\pm\gamma B_1\tan(\arcsin(\omega_s t))$ and $\omega(t)=\omega_O\pm\gamma B_1\tan(\omega_s t)$, respectively. It is our intent, therefore, to be limited only by the scope of the appending claims and not by the particular examples presented by way of explanation and illustration herein.

What we claim is:

1. A method for complete inversion of magnetization by adiabatic fast passage during an NMR investigation of a sample having a selected nuclear specie with a Larmor frequency $\omega_O$, comprises the steps of:
   (a) generating a radio-frequency (RF) magnetic field having an amplitude $B_1$ and an instantaneous frequency $\omega(t)$;
   (b) controlling the frequency $\omega(t)$ to non-linearly sweep as a time function $\omega(t)=\omega_O+\alpha\gamma B_1\tan(\text{arc sin}(\omega_s t))$, where $\gamma$ is the gyromagnetic constant of the selected nuclear specie and $\omega_s=\alpha\gamma B_1$ and $0<\alpha\leq1$, during a preselected time interval, from a first frequency, selected from one of a minimum frequency $\omega_l$ substantially at a maximum offset frequency $\Delta\omega$ below the Larmor frequency $\omega_O$, and a maximum frequency $\omega_h$ substantially at the maximum offset frequency $\Delta\omega$ above the Larmor frequency, through the Larmor $\omega_O$ frequency, to a second frequency which is the remaining one of the minimum and maximum frequencies; and
   (c) applying the non-linearly swept RF signal to the sample being investigated to substantially invert the magnetization of the selected nuclear specie.

2. The method of claim 1, wherein $\omega_O$ is on the order of $2\pi \times (63 \text{ Mhz.})$ 3. The method of claim 1, wherein $\Delta\omega$ is on the order of $2\pi \times$ (10 KHz.)

4. The method of claim 1, wherein the magnetization is substantially completely inverted at each of a plurality of nodes of the tangential function, each node occurring at a different time after commencement of the sweep; and step (c) includes the step of terminating the non-linear-swept RF signal substantially at a selected node occurrence time.

5. The method of claim 4, wherein the second node time is selected.

6. The method of claim 5, wherein $\Delta\omega$ is about $2\pi \times$ (10 KHz.)

7. The method of claim 6, wherein $\omega_O$ is on the order of $2\pi \times$ (63 MHz.)

8. Apparatus for generating an RF magnetic field excitation signal, for obtaining a complete magnetization inversion by adiabatic fast passage during an NMR investigation of a sample having a selected nuclear specie with a Larmor frequency $\omega_O$, comprising:

means for generating an RF signal having an instantaneous frequency responsive to the amplitude of a control signal during a sweep time interval;

means for generating said control signal as a nonlinear ramp signal having initial, mid and final values, said initial value causing said frequency to be at a selected one of a minimum frequency $\omega_l$ substantially at a maximum offset frequency $\omega w$ below the Larmor frequency $\omega_O$ and a maximum frequency $\omega_h$ substantially equal to said maximum offset frequency $\Delta\omega$ above said Larmor frequency $\omega_O$ midvalue causing said frequency sweep to be substantially at said Larmor frequency $\omega_O$ and said final value causing said frequency sweep to be at the remaining one of said minimum and maximum frequencies; and means for applying said RF signal to said sample as an RF magnetic field with a selected amplitude $B_1$;

said control signal generating means and said RF generating means cooperating to cause said RF magnetic field signal to have a swept frequency $\omega(t)$ essentially equal to one of the equations: $\omega(t) = \omega_O \pm \gamma B_1 \tan(\arcsin(\omega_S t))$ and $\omega(t) = a_O \pm \gamma B_1 \tan(\omega_S t)$, where $\omega_S = \alpha\gamma B_1$, $\gamma$ is the gyromagnetic ratio for the selected nuclear specie and $0 < \alpha \leq 1$.

9. The apparatus of claim 8, wherein said RF generating means includes: VCO means for generating a first RF signal responsive to said control signal and having a frequency $F'_{RF}$ responsive to said mid value of said ramp signal and outside the band of frequencies within said maximum offset frequency $\Delta\omega$ from said Larmor frequency $\omega_O$; oscillator means for providing a second RF signal at a frequency $F_K$ selected such that one of the sum and difference products of $F'_{RF}$ and $F_K$ is essentially at said Larmor frequency; and means, receiving said first and second signals, for providing said RF signal as the selected product of said first and second signals.

10. The apparatus of claim 9, further including means for reducing the amplitude of said RF signal substantially to zero except during said sweep time interval.

11. The apparatus of claim 9, wherein said control signal generating means includes a ramp generator having a monotonic non-linear ramp signal output and having means for adjusting the sweep time of said output signal to essentially equal the desired sweep time interval and means for adjusting the ramp amplitude variational value for controlling the RF generating means over a contiguous range of frequencies essentially equal to $2\Delta\omega$.

* * * * *